US010431550B2

(12) United States Patent
Han et al.

(10) Patent No.: US 10,431,550 B2
(45) Date of Patent: Oct. 1, 2019

(54) FAN-OUT ELECTRONIC COMPONENT PACKAGE

(71) Applicant: Samsung Electro-Mechanics Co., Ltd., Suwon-si (KR)

(72) Inventors: Myeong Woo Han, Suwon-si (KR); Chan Yong Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/980,970

(22) Filed: May 16, 2018

(65) Prior Publication Data

US 2018/0337136 A1  Nov. 22, 2018

(30) Foreign Application Priority Data

May 16, 2017 (KR) .................. 10-2017-0060621
Feb. 28, 2018 (KR) .................. 10-2018-0024693

(51) Int. Cl.
*H01L 23/538* (2006.01)
*H01L 25/18* (2006.01)
(Continued)

(52) U.S. Cl.
CPC ...... *H01L 23/5389* (2013.01); *H01L 23/3128* (2013.01); *H01L 23/3135* (2013.01);
(Continued)

(58) Field of Classification Search
None
See application file for complete search history.

(56) References Cited

U.S. PATENT DOCUMENTS

2002/0135269 A1  9/2002 Kinoshita
2003/0220083 A1  11/2003 Lee et al.
(Continued)

FOREIGN PATENT DOCUMENTS

JP  2002-290200 A  10/2002
JP  2007-214566 A  3/2007
(Continued)

OTHER PUBLICATIONS

United States Office Action dated Feb. 26, 2019 in related U.S. Appl. No. 15/790,904 (12 pages in English).
(Continued)

*Primary Examiner* — Grant S Withers
(74) *Attorney, Agent, or Firm* — NSIP Law

(57) ABSTRACT

A fan-out electronic component package includes a core, a first electronic component, a first encapsulant, a connection member, a second electronic component, and a second encapsulant. The core member includes a through-hole, wiring layers and vias configured to electrically connect the wiring layers to each other. The first electronic component is disposed in the through-hole, and comprising filters configured to filter different frequency bands. The first encapsulant covers portions of the core member and the first electronic component, and fills portions of the through-hole. The connection member is disposed on the core member and the first electronic component, and includes a redistribution layer electrically connected to the wiring layers and the first electronic component. The second electronic component is disposed on the connection member and electrically connects to the redistribution layer. The second encapsulant is disposed to cover the second electronic component.

20 Claims, 12 Drawing Sheets

(51) Int. Cl.
*H01L 23/00* (2006.01)
*H01L 23/31* (2006.01)
*H03H 9/10* (2006.01)
*H03H 9/17* (2006.01)
*H03H 9/56* (2006.01)
*H03H 9/54* (2006.01)
*H03H 9/70* (2006.01)
*H01L 27/20* (2006.01)
*H01L 23/66* (2006.01)
*H04B 1/40* (2015.01)
*H03H 9/05* (2006.01)

(52) U.S. Cl.
CPC ...... *H01L 23/5383* (2013.01); *H01L 23/5384* (2013.01); *H01L 23/5385* (2013.01); *H01L 23/66* (2013.01); *H01L 24/20* (2013.01); *H01L 25/18* (2013.01); *H01L 27/20* (2013.01); *H03H 9/105* (2013.01); *H03H 9/173* (2013.01); *H03H 9/545* (2013.01); *H03H 9/56* (2013.01); *H03H 9/703* (2013.01); *H01L 2223/6677* (2013.01); *H01L 2224/214* (2013.01); *H03H 9/0547* (2013.01); *H03H 9/1014* (2013.01); *H04B 1/40* (2013.01)

(56) References Cited

U.S. PATENT DOCUMENTS

| | | |
|---|---|---|
| 2004/0164367 A1 | 8/2004 | Park |
| 2007/0080757 A1 | 4/2007 | Yahata et al. |
| 2007/0182510 A1 | 8/2007 | Park et al. |
| 2010/0044845 A1* | 2/2010 | Funaya ............... H01L 21/6835 257/685 |
| 2013/0001762 A1* | 1/2013 | Chi ..................... H01L 21/4832 257/676 |
| 2013/0027153 A1 | 1/2013 | Shin et al. |
| 2014/0048906 A1* | 2/2014 | Shim .................... H01L 23/481 257/531 |
| 2014/0062607 A1* | 3/2014 | Nair ........................ H01L 25/16 331/68 |
| 2016/0338202 A1 | 11/2016 | Park et al. |
| 2016/0358889 A1* | 12/2016 | Lai ........................ H01L 23/481 |
| 2017/0133998 A1 | 5/2017 | Hino |
| 2019/0139853 A1* | 5/2019 | Oh ........................ H01L 23/367 |

FOREIGN PATENT DOCUMENTS

| | | |
|---|---|---|
| JP | 2007-110202 A | 4/2007 |
| KR | 2003-0091660 A | 12/2003 |
| KR | 10-0486627 B1 | 5/2005 |
| KR | 10-0500391 B1 | 7/2005 |
| KR | 10-2010-0058078 A | 6/2010 |
| KR | 10-2016-0132763 A | 11/2016 |

OTHER PUBLICATIONS

Korean Office Action dated Jul. 10, 2019 in counterpart Korean Patent Application No. 10-2018-0024693 (6 pages in English and 5 pages in Korean).

* cited by examiner

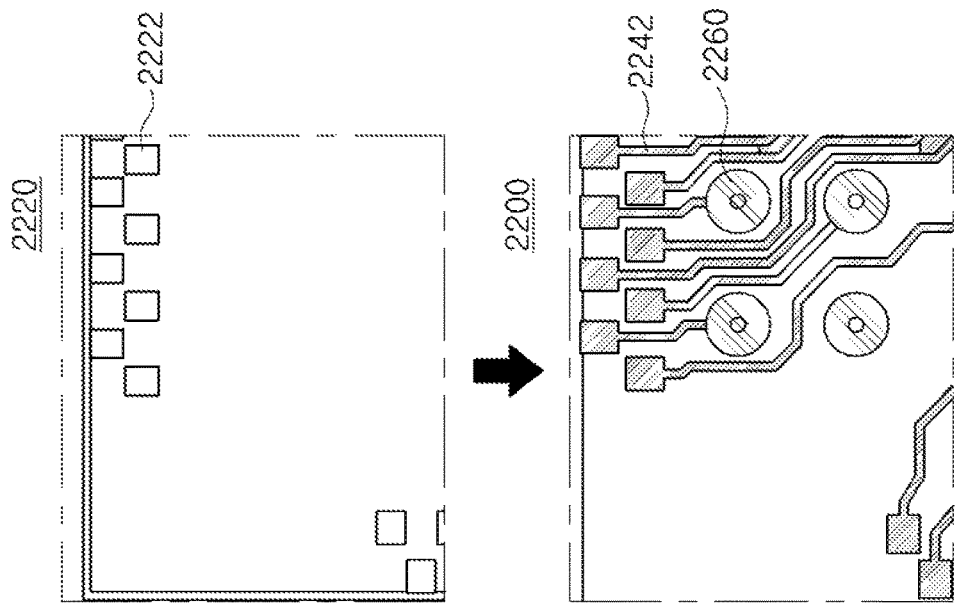
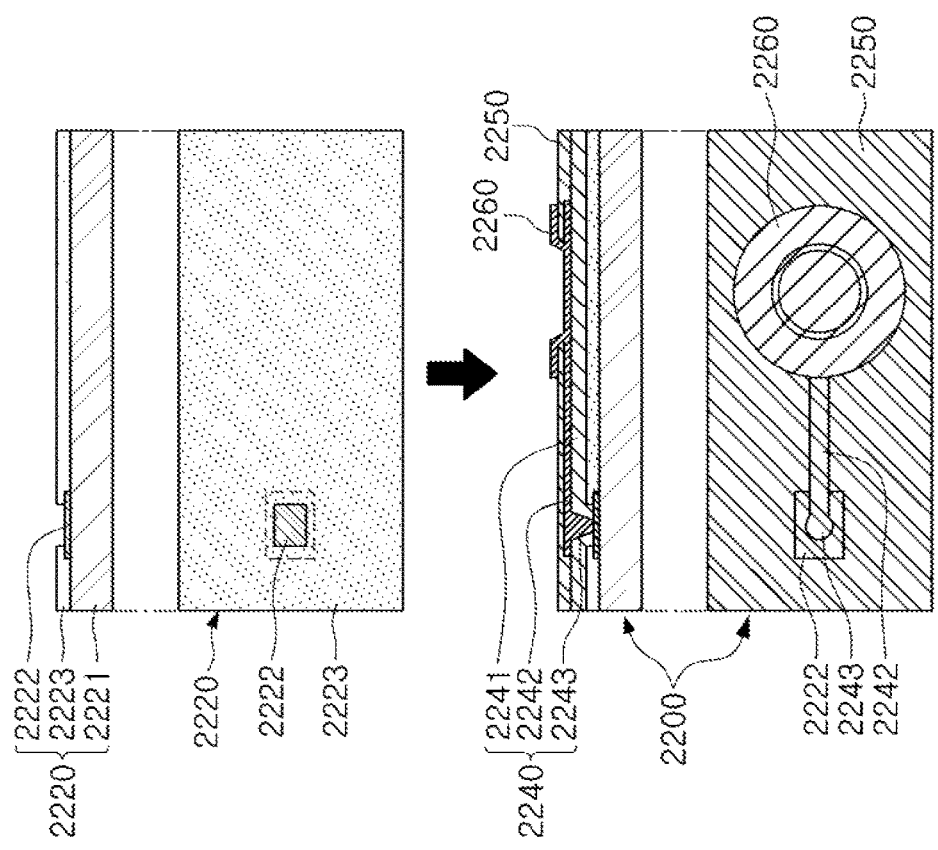
FIG. 3A
FIG. 3B

FAN-OUT ELECTRONIC COMPONENT PACKAGE

CROSS-REFERENCE TO RELATED APPLICATIONS

This application claims benefit under 35 USC 119(a) of Korean Patent Application No. 10-2017-0060621 filed on May 16, 2017, and 10-2018-0024693 filed on Feb. 28, 2018 in the Korean Intellectual Property Office, the entire disclosure of which is incorporated herein by reference for all purposes.

BACKGROUND

1. Field

The following description relates to an electronic component package, and more particularly, to a fan-out electronic component package.

2. Description of Related Art

Recently, electronic devices have been implemented with the ability to support communications services using different communications networks, for example, a global system for mobile communications (GSM) network and a long term evolution (LTE) network.

Such a terminal used for both GSM and LTE may include a front end module connected to an antenna terminal. Generally, the front end module may include a switching element connected to an antenna, a duplexer or a filter element isolating bands of radio frequency signals transmitted and received through the antenna or passing specific bands of the radio frequency signals therethrough, an amplifying element amplifying the transmitted radio frequency signals, and the like.

In general, when the front end module includes an electronic component package formed of separate filters for each band of the radio frequency signals, there is a limitation in reducing a size of the front end module, which makes it difficult to minimize an electronic device that includes the front end module.

In addition, recently, a space in which an electronic component package is mounted is limited due to the trend for the miniaturization of electronic devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a fan-out electronic component package includes a core, a first electronic component, a first encapsulant, a connection member, a second electronic component, and a second encapsulant. The core member includes a through-hole, wiring layers and vias configured to electrically connect the wiring layers to each other. The first electronic component is disposed in the through-hole, and comprising filters configured to filter different frequency bands. The first encapsulant covers portions of the core member and the first electronic component, and fills portions of the through-hole. The connection member is disposed on the core member and the first electronic component, and includes a redistribution layer electrically connected to the wiring layers and the first electronic component. The second electronic component is disposed on the connection member and electrically connects to the redistribution layer. The second encapsulant is disposed to cover the second electronic component.

The connection member may include an insulating layer. The redistribution layer may be disposed on the insulating layer. Vias may electrically connect the redistribution layer and the first electronic component to each other.

1-1-th connection pads may electrically connect to the connection member. 1-2-th connection pads may electrically connect to a mainboard of an electronic device are formed on the first electronic component.

The first electronic component may include: first and second substrates coupled to each other to form an internal space; a first filter formed on the first substrate to be disposed in the internal space, and comprising a bulk acoustic resonator; and a second filter formed on the second substrate.

1-1-th connection pads may electrically connect to the redistribution layer formed on the second substrate. 1-2-th connection pads may electrically connect to a mainboard of an electronic device are formed on the first substrate.

The fan-out electronic component package may further include: a backside wiring layer disposed on a surface of the first encapsulant opposing another surface of the first encapsulant on which the connection member is disposed; backside vias configured to penetrate through the first encapsulant and connect the backside wiring layer to the 1-2-th connection pads; and underbump metal layers connected to the backside wiring layer.

The second filter may be formed on an outer surface of the second substrate.

The first substrate and the second substrate may be high resistivity silicon (HRS) substrates.

In another general aspect, a fan-out electronic component package includes a first structure and a second structure. The first structure includes a first electronic component, a first encapsulant encapsulating, and a first connection member. The first electronic component has a 1-1-th active surface and a 1-2-th active surface. 1-1-th connection pads are disposed on the 1-1-th active surface. 1-2-th connection pads are disposed on the 1-2-th active surface. The 1-2-th active surface opposes the 1-1-th active surface. The first encapsulant encapsulates portions of the first electronic component. The first connection member is disposed on the 1-1-th active surface and includes a first redistribution layer electrically connected to the 1-1-th connection pads. The second structure includes a second electronic component, a second encapsulant, and a second connection member. The second electronic component has a second active surface, wherein second connection pads are disposed on the second active surface. The second encapsulant encapsulates portions of the second electronic component. The second connection member is disposed on the second active surface and includes a second redistribution layer electrically connected to the second connection pads. The first electronic component includes filters configured to filter different frequency bands.

The fan-out electronic component package may further include a backside wiring layer disposed on a surface of the first encapsulant opposing another surface of the first encapsulant on which the first connection member is disposed; backside vias configured to penetrate through the first encapsulant and connect the backside wiring layer to the 1-2-th connection pads; and underbump metal layers connected to the backside wiring layer.

The first electronic component may include: first and second substrates coupled to each other to form an internal space; a first filter formed on the first substrate to be disposed in the internal space, connected to the 1-2-th connection pads, and including a bulk acoustic resonator; and a second filter formed on the second substrate to be disposed outside the internal space and connected to the 1-1-th connection pads.

The first structure may further include a first core member having a first through-hole. The first electronic component may be disposed in the first through-hole.

The first structure may further include a first core member having a first through-hole and a second through-hole spaced apart from the first through-hole. The first electronic component may be disposed in the first through-hole, and a semiconductor chip may be disposed in the second through-hole.

Other features and aspects will be apparent from the following detailed description, the drawings, and the claims.

BRIEF DESCRIPTION OF DRAWINGS

FIGS. 3A and 3B are schematic cross-sectional views illustrating states of a fan-in electronic component package before and after being packaged.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
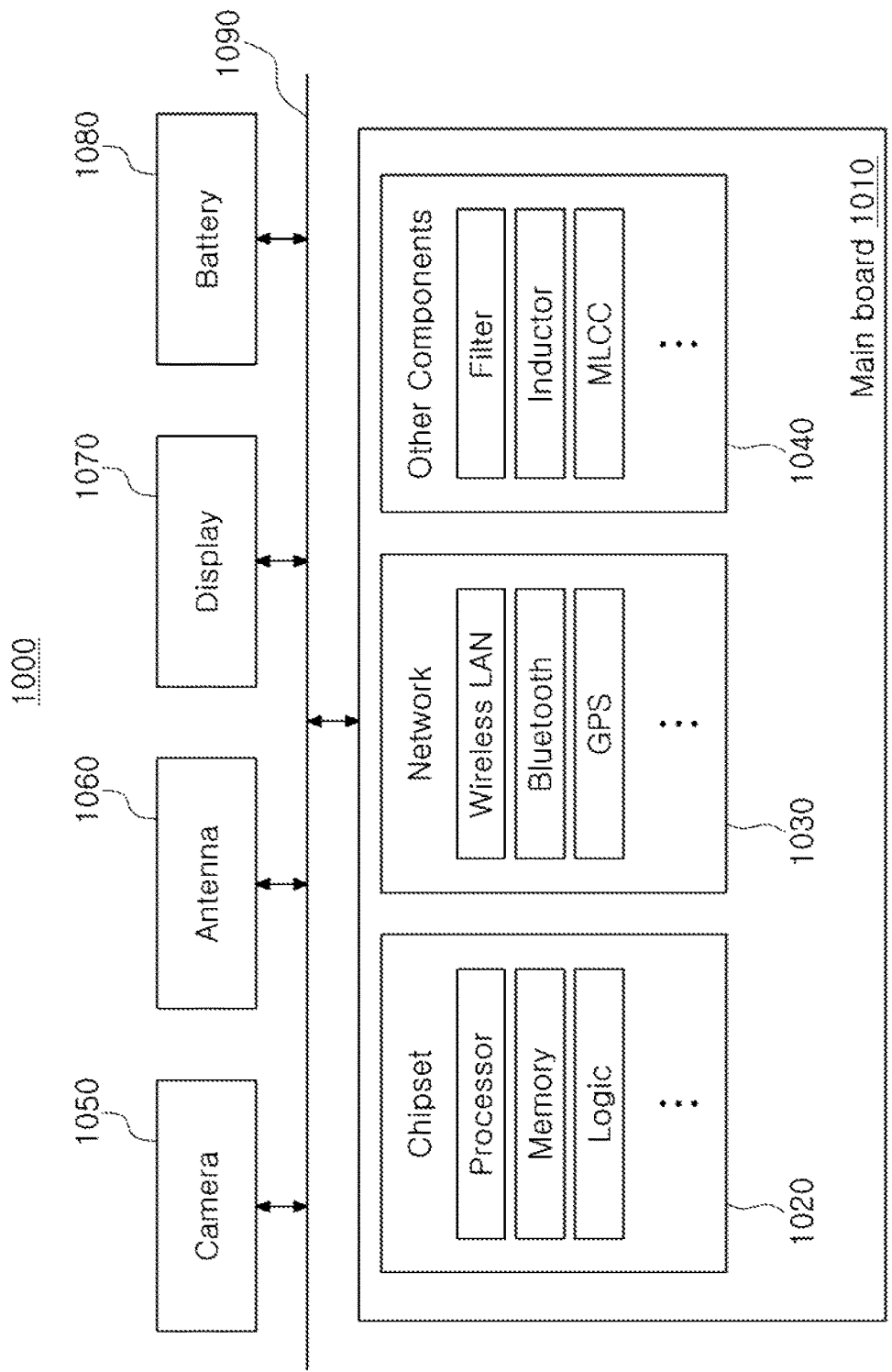
FIG. 1 is a schematic block diagram illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, a lower side, a lower portion, a lower surface, and the like, are used to refer to a direction toward a mounting surface of a fan-out electronic component package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component herein includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example" used herein does not refer to the same example, and is provided to emphasize a particular feature or characteristic different from that of another example. However, examples provided herein are considered to be able to be implemented by being combined in whole or in part one with one another. For example, one element described in a particular example, even if it is not described in another example, may be understood as a description related to another example, unless an opposite or contradictory description is provided therein.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access + (HSPA+), high speed downlink packet access+ (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
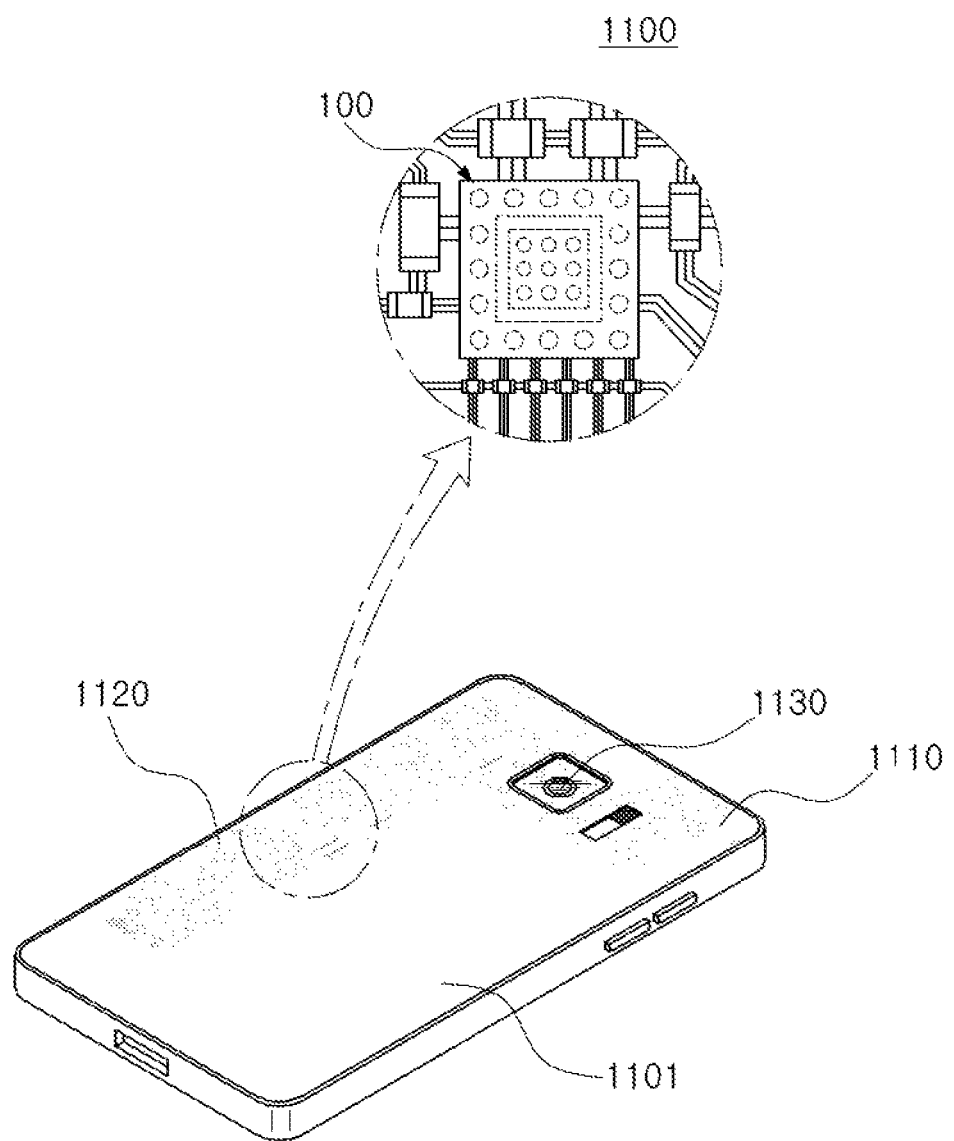
FIG. 2 is a schematic perspective view illustrating an example of an electronic device.

FIG. 2 is a schematic perspective view illustrating an example of an electronic device.

Referring to FIG. 2, an electronic component package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Electronic Component Package

In the present specification, an electronic component may be a semiconductor chip. Generally, numerous tiny electrical circuits are integrated in a semiconductor chip. However, the semiconductor chip may not serve as a finished semiconductor product in itself, and may be damaged from external physical or chemical impacts. The semiconductor chip itself may, therefore, be packaged or enclosed in an electronic device, or the like.

Here, the semiconductor packaging is desired due to the existence of a difference in a circuit width between the semiconductor chip and a mainboard of the electronic device. In detail, the size of connection pads of the semiconductor chip and an interval between the connection pads of the semiconductor chip are very tiny, but the size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology to buffer the difference in a circuit width between the semiconductor chip and the mainboard is required.

An electronic component package manufactured by the packaging technology may be classified as a fan-in electronic component package or a fan-out electronic component package depending on a structure and a purpose thereof.

The fan-in electronic component package and the fan-out electronic component package will hereinafter be described in more detail with reference to the drawings.

Fan-In Electronic Component Package

FIGS. 3A and 3B are schematic cross-sectional views illustrating states of a fan-in electronic component package before and after being packaged.

Figure 4:
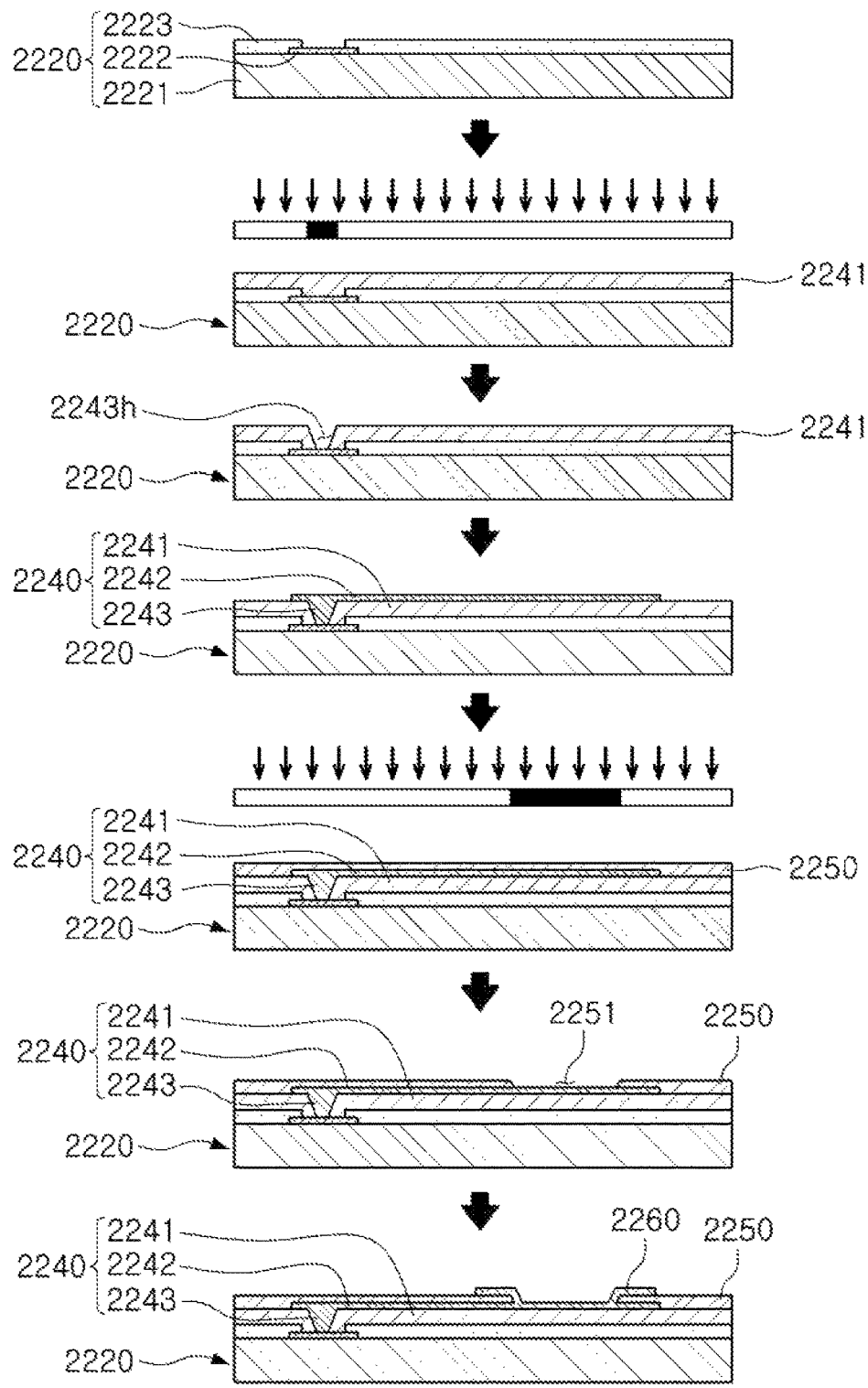
FIG. 4 is schematic cross-sectional views illustrating a packaging process of a fan-in electronic component package.

FIG. 4 is schematic cross-sectional views illustrating a packaging process of a fan-in electronic component package.

Referring to FIGS. 3 and 4, a semiconductor chip 2220 may be, for example, an integrated circuit (IC) in a bare state, including a body 2221, connection pads 2222, and a passivation layer 2223. The body 2221 may include silicon (Si), germanium (Ge), gallium arsenide (GaAs), or the like. The connection pads 2222 may be formed on one surface of the body 2221 and may include a conductive material such as aluminum (Al), or the like. The passivation layer 2223 may be an oxide layer, a nitride layer, or the like, formed on one surface of the body 2221, and covers at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in electronic component package 2200 including, for example, the semiconductor chip 2220, the connection member 2240, the passivation layer 2250, and the underbump metal layer 2260 may be manufactured through a series of processes.

As described above, the fan-in electronic component package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in electronic component package form. In detail, many elements mounted in smartphones have been developed to implement a rapid signal transfer while having a compact size.

However, since all I/O terminals need to be disposed inside the semiconductor chip in the fan-in electronic component package, the fan-in electronic component package has significant spatial limitations. Therefore, it is difficult to apply a fan-in structure to a semiconductor chip having a large number of I/O terminals or a miniaturized semiconductor chip. In addition, due to the disadvantage described above, the fan-in electronic component package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
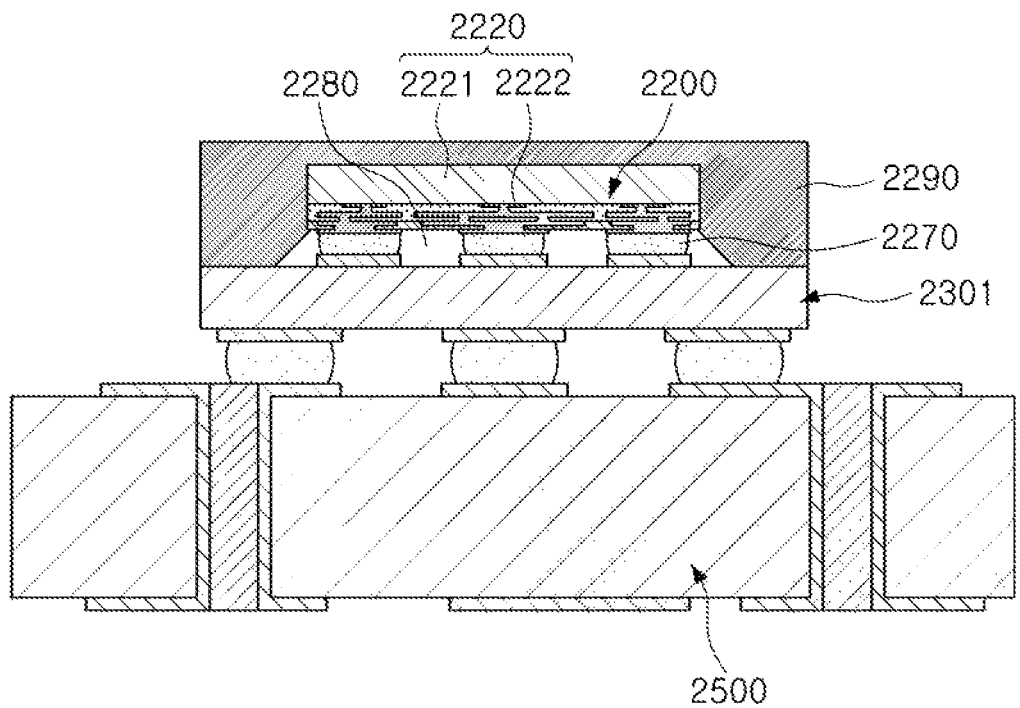
FIG. 5 is a schematic cross-sectional view illustrating a case in which a fan-in electronic component package is mounted on a ball grid array (BGA) substrate and a mainboard of an electronic device.

FIG. 5 is a schematic cross-sectional view illustrating a case in which a fan-in electronic component package is mounted on a ball grid array (BGA) substrate and is ultimately mounted on a mainboard of an electronic device.

Figure 6:
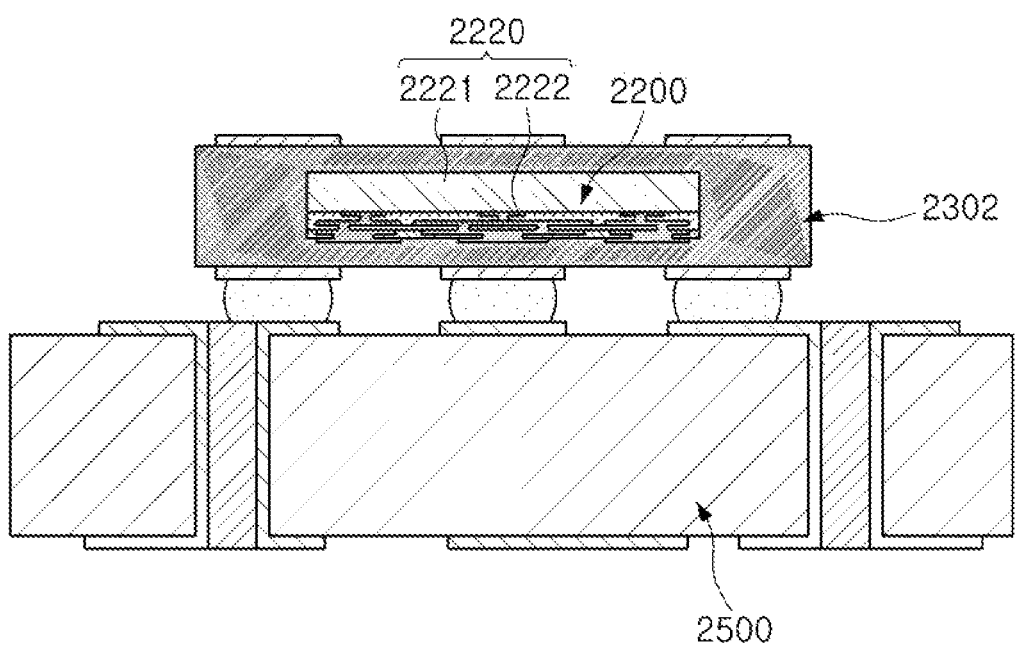
FIG. 6 is a schematic cross-sectional view illustrating a case in which a fan-in electronic component package is embedded in a BGA substrate and is ultimately mounted on a mainboard of an electronic device.

FIG. 6 is a schematic cross-sectional view illustrating a case in which a fan-in electronic component package is embedded in a BGA substrate and is ultimately mounted on a mainboard of an electronic device.

Referring to FIGS. 5 and 6, in a fan-in electronic component package 2200, connection pads 2222, i.e., I/O terminals, of a semiconductor chip 2220 may be redistributed through a BGA substrate 2301. The fan-in electronic component package 2200 may be ultimately mounted on a mainboard 2500 of an electronic device in a state in which it is mounted on the BGA substrate 2301. In this case, for example, the solder balls 2270 may be fixed by an underfill resin 2280, and an outer side of the semiconductor chip 2220 may be covered with a molding material 2290.

Alternatively, a fan-in electronic component package 2200 may be embedded in a separate BGA substrate 2302, connection pads 2222, i.e., I/O terminals, of the semiconductor chip 2220 may be redistributed by the BGA substrate 2302 in a state in which the fan-in electronic component package 2200 is embedded in the BGA substrate 2302. The fan-in electronic component package 2200 may be ultimately mounted on a mainboard 2500 of an electronic device.

As described above, it may be difficult to directly mount and use the fan-in electronic component package on the mainboard of the electronic device. Therefore, the fan-in electronic component package may be mounted on the separate BGA substrate and then mounted on the mainboard of the electronic device through a packaging process or may be mounted and used on the mainboard of the electronic device by embedding fan-in electronic component package in the BGA substrate.

Fan-Out Electronic Component Package

Figure 7:
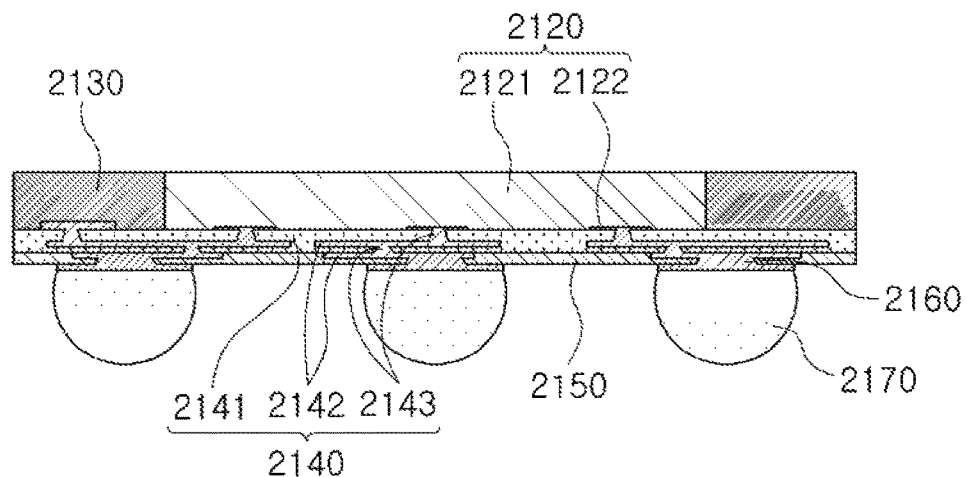
FIG. 7 is a schematic cross-sectional view illustrating a fan-out electronic component package.

FIG. 7 is a schematic cross-sectional view illustrating a fan-out electronic component package.

Referring to FIG. 7, in a fan-out electronic component package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out electronic component package may have a form in which I/O terminals of the semiconductor chip are redistributed and disposed outwardly of the semiconductor chip through the connection member formed on the semiconductor chip. However, as described above, in the fan-in electronic component package, all I/O terminals of the semiconductor chip need to be disposed inside the semiconductor chip. Therefore, when the size of the semiconductor chip is decreased, the size and the pitch of balls need to be decreased, such that a standardized ball layout may not be used in the fan-in electronic component package. On the other hand, the fan-out electronic component package has the form in which the I/O terminals of the semiconductor chip are redistributed and disposed outwardly of the semiconductor chip through the connection member formed on the semiconductor chip as described above. Therefore, even in a case in which the size of the semiconductor chip is decreased, a standardized ball layout may be used in the fan-out electronic component package as it is, and the fan-out electronic component package may be mounted on the mainboard of the electronic device without using a separate BGA substrate, as described below.

Figure 8:
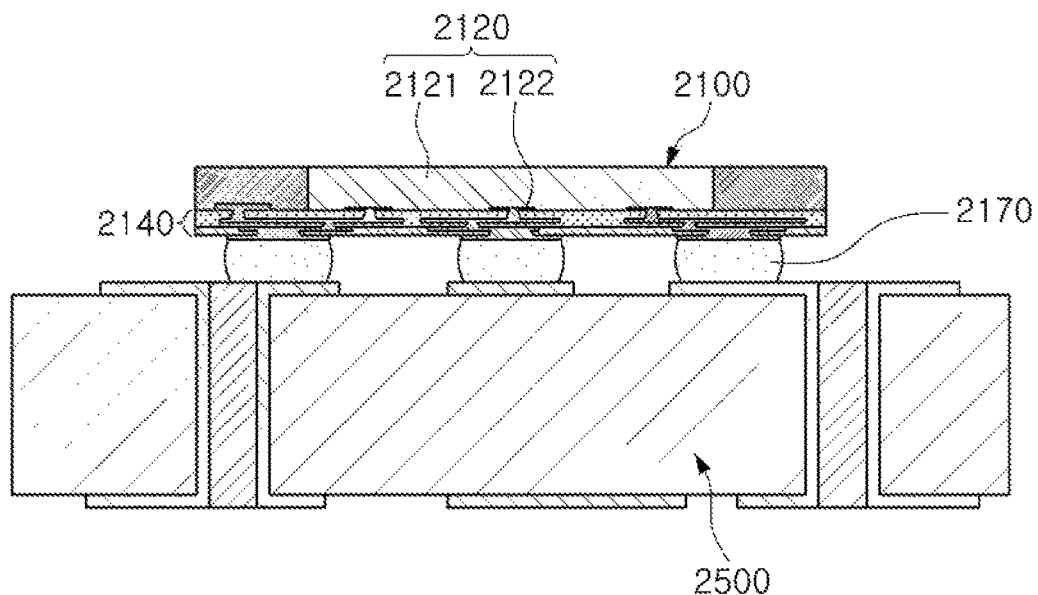
FIG. 8 is a schematic cross-sectional view illustrating a case in which a fan-out electronic component package is mounted on a mainboard of an electronic device.

FIG. 8 is a schematic cross-sectional view illustrating a case in which a fan-out electronic component package is mounted on a mainboard of an electronic device.

Referring to FIG. 8, a fan-out electronic component package 2100 may be mounted on a mainboard 2500 of an electronic device through solder balls 2170, or the like. That is, as described above, the fan-out electronic component package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out electronic component package 2100 as it is. As a result, the fan-out electronic component package 2100 may be mounted on the mainboard 2500 of the electronic device without using a separate BGA substrate, or the like.

As described above, since the fan-out electronic component package may be mounted on the mainboard of the electronic device without using the separate BGA substrate, the fan-out electronic component package may be implemented at a thickness lower than that of the fan-in electronic component package using the BGA substrate. Therefore, the fan-out electronic component package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

A fan-out electronic component package refers to package technology for mounting the semiconductor chip on the mainboard of the electronic device, or the like, as described above, and protecting the semiconductor chip from external impacts. A fan-out electronic component package is a concept different from that of a printed circuit board (PCB) such as a BGA substrate, or the like, having a scale, a purpose, and the like, different from those of the fan-out electronic component package, and having the fan-in electronic component package embedded therein.

A fan-out electronic component package capable of being thinned and miniaturized in spite of having a plurality of semiconductor chips, reducing signal loss by shortening a connection distance between chips, and having improved reliability by securing with sufficient rigidity will hereinafter be described with reference to the drawings.

Figure 9:
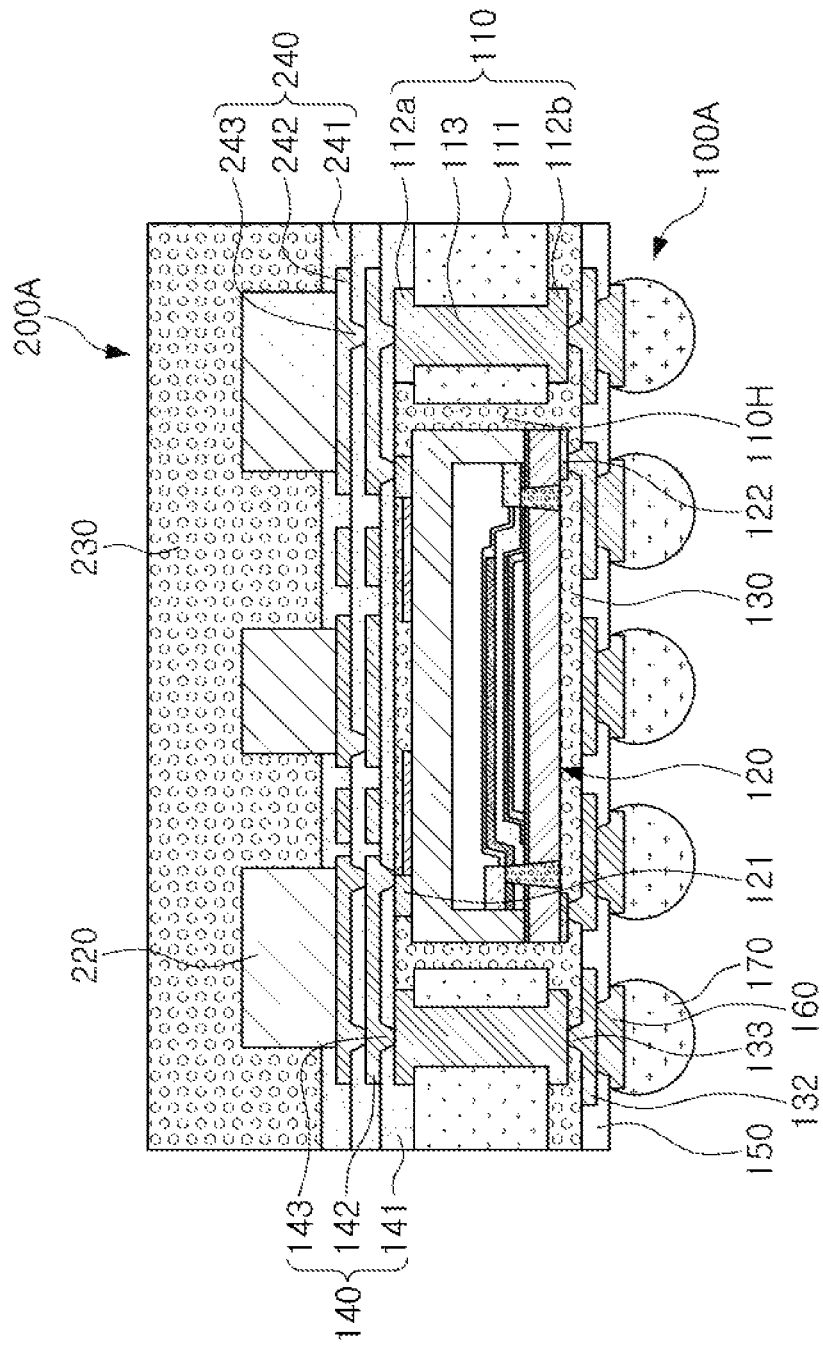
FIG. 9 is a schematic cross-sectional view illustrating an example of a fan-out electronic component package.

FIG. 9 is a schematic cross-sectional view illustrating an example of a fan-out electronic component package.

Referring to FIG. 9, a fan-out electronic component package according to an example in the present disclosure may include a first structure 100A and a second structure 200A. The first structure 100A includes a first core member 110 having a first through-hole 110H, a first semiconductor chip 120 disposed in the first through-hole 110H and having a 1-1-th active surface having 1-1-th connection pads 121 disposed thereon and a 1-2-th active surface having 1-2-th connection pads 122 disposed thereon and opposing the 1-1-th active surface, a first encapsulant 130 encapsulating at least portions of the first semiconductor chip 120 and filling at least portions of the first through-hole 110H, and a first connection member 140 disposed on the first core member 110 and the 1-1-th active surface and including a first redistribution layer 142 electrically connected to the 1-1-th connection pads 121. The second structure 200A includes at least one second semiconductor chip 220 having a second active surface having second connection pads disposed thereon, a second connection member 240 including a second redistribution layer 242 electrically connected to the second connection pads, and a second encapsulant 230 encapsulating at least portions of the second semiconductor chip 220.

The first and second structures 100A and 200A may be disposed so that the 1-1-th active surface and the second active surface face each other. Although not illustrated in FIG. 9, an underfill resin may be disposed between the first and second connection members 140 and 240, and may cover at least portions between the first and second connection members 140 and 240.

The first core member 110 includes a plurality of wiring layers 112a and 112b and vias 113, and may thus serve as a connection member connecting upper and lower portions to each other, and the wiring layers 112a and 112b may be electrically connected to the 1-1-th connection pads 121 through the first redistribution layer 142. In addition, the wiring layers 112a and 112b may also be electrically connected to the second connection pads through the second redistribution layer 242.

The first structure 100A may further include a backside wiring layer 132, backside vias 133, a passivation layer 150, underbump metal layers 160, and electrical connection structures 170.

The backside wiring layer 132 is disposed on the other surface of the first encapsulant 130 opposing one surface of the first encapsulant 130 on which the first connection member 140 is disposed. The backside vias 133 penetrate through, at least, portions of the first encapsulant 130 and connect the backside wiring layer 132 to a second wiring layer 112b of the first core member 110 and/or the 1-2-th connection pads 122. The passivation layer 150 is disposed on the first encapsulant 130 and has openings exposing at least portions of the backside wiring layer 132. The underbump metal layers 160 are formed in the openings of the passivation layer 150 and connected to the exposed backside wiring layer 132. The electrical connection structures 170 are disposed on the passivation layer 150 and connected to the underbump metal layers 160. In this way, the fan-out electronic component package according to the example may be mounted on and be electrically connected to the mainboard of the electronic device.

In the fan-out electronic component package according to the example, the first and second semiconductor chips 120 and 220 may be disposed in a package-on-chip form, and the first semiconductor chip 120 and the second semiconductor chip 220 may be disposed so that the 1-1-th active surface and the second active surface face each other. In addition, the first redistribution layer 142 and the second redistribution layer 242 redistributing the 1-1-th connection pads 121 and the second connection pads of the first and second semiconductor chips 120 and 220, respectively, may also be disposed to face each other. In this case, the first redistribution layer 142 and the second redistribution layer 242 may be directly connected to each other with a low melting point metal, and may be protected by an underfill resin, or the like. That is, even though the fan-out electronic component package has package-on-chip form, the fan-out electronic component package may be thinned as much as possible, and a signal path between the first and second semiconductor chips 120 and 220 may be significantly reduced. The fan-out electronic component package has the package-on-chip form, and may thus be basically miniaturized. In addition, such a connection form may implement a package-on-chip without using a separate expensive material such as a photoimagable encapsulant (PIE), or the like, and may also be reworked to reduce costs. Particularly, the fan-out electronic component package may have significant advantages in terms of thinness, miniaturization, signal stability, costs, and the like, as compared to a package using wire bonding based on related art.

The respective components included in the fan-out electronic component package according to the example will hereinafter be described below in more detail.

First, the first structure 100A may include the first core member 110 having the first through-hole 110H, the first semiconductor chip 120 disposed in the first through-hole 110H and having the 1-1-th active surface having the 1-1-th connection pads 121 disposed thereon and the 1-2-th active surface having the 1-2-th connection pads 122 disposed thereon and opposing the 1-1-th active surface, the first encapsulant 130 encapsulating at least portions of the first semiconductor chip 120 and filling at least portions of the first through-hole 110H, and the first connection member 140 disposed on the first core member 110 and the 1-1-th active surface and including the first redistribution layer 142 electrically connected to the 1-1-th connection pads 121.

In addition, the first structure 100A may further include the backside wiring layer 132 disposed on the other surface of the first encapsulant 130 opposing one surface of the first encapsulant 130 on which the first connection member 140 is disposed, the backside vias 133 penetrating through at least portions of the first encapsulant 130 and connecting the backside wiring layer 132 to the second wiring layer 112b of the first core member 110 and/or the 1-2-th connection pads 122, the passivation layer 150 disposed on the first encapsulant 130 and having the openings exposing at least portions of the backside wiring layer 132, the underbump metal layers 160 formed in the openings of the passivation layer 150 and connected to the exposed backside wiring layer 132, and the electrical connection structures 170 disposed on the passivation layer 150 and connected to the underbump metal layers 160.

The first core member 110 may maintain rigidity of the first structure 100A depending on materials used, and serve to secure uniformity of a thickness of the first encapsulant 130. The 1-1-th connection pads 121 of the first semiconductor chip 120 may be electrically connected to the mainboard of the electronic device through the electrical connection structures 170, or the like, by the first core member 110.

The first core member 110 may include the plurality of wiring layers 112a and 112b to effectively redistribute the 1-1-th connection pads 121 of the first semiconductor chip 120, and may provide a wide wiring design region to suppress redistribution layers from being formed in other regions.

The first semiconductor chip 120 may be disposed in the first through-hole 110H to be spaced apart from the first core member 110 by a predetermined distance. Side surfaces of the first semiconductor chip 120 may be surrounded by the first core member 110. The first core member 110 may include an insulating layer 111, a first wiring layer 112a disposed on an upper surface of the insulating layer 111, the second wiring layer 112b disposed on a lower surface of the insulating layer 111, and the vias 113 penetrating through the insulating layer 111 and electrically connecting the first and second wiring layers 112a and 112b to each other.

For example, a material including an inorganic filler and an insulating resin may be used as a material of the insulating layer 111. For example, a thermosetting resin such as an epoxy resin, a thermoplastic resin such as a polyimide resin, or a resin including a reinforcing material such as an inorganic filler, for example, silica, alumina, or the like, more specifically, Ajinomoto Build up Film (ABF), FR-4, Bismaleimide Triazine (BT), a photoimagable dielectric (PID) resin, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may be used. In this case, excellent rigidity of the first structure 100A may be maintained, such that the first core member 110 may be used as a kind of support member.

The wiring layers 112a and 112b may include a conductive material such as copper (Cu), aluminum (Al), silver (Ag), tin (Sn), gold (Au), nickel (Ni), lead (Pb), titanium (Ti), or alloys thereof. The wiring layers 112a and 112b may perform various functions depending on designs of corresponding layers. For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a and 112b may include pad patterns for vias, pad patterns for electrical connection structures, and the like.

Thicknesses of the wiring layers 112a and 112b of the first core member 110 may be greater than that of the first redistribution layer 142 of the first connection member 140. The reason is that the first core member 110 may have a thickness similar to that of the first semiconductor chip 120, but the first connection member 140 needs to be thinned.

The vias 113 may penetrate through the insulating layer 111 and electrically connect the first wiring layer 112a and the second wiring layer 112b to each other. A material of each of the vias 113 may be a conductive material. Each of the vias 113 may be completely filled with the conductive material, or the conductive material may be formed along a wall of each of via holes. Each of the vias 113 may be a through-via completely penetrating through the insulating layer 111, and may have a cylindrical shape or a hourglass shape, but is not limited thereto.

The first semiconductor chip 120 may be an integrated circuit (IC) provided in an amount of several hundred to several million or more elements integrated in a single chip or a filter including a bulk acoustic resonator.

The first semiconductor chip 120 will be described below with reference to FIGS. 11 through 15.

The first encapsulant 130 may protect the first semiconductor chip 120. An encapsulation form of the first encapsulant 130 is not particularly limited, but may be a form in which the first encapsulant 130 surrounds at least portions of the first semiconductor chip 120. In this case, the first encapsulant 130 may cover the first core member 110 and the 1-2-th active surface of the first semiconductor chip 120, and fill at least portions of the first through-hole 110H. A certain material of the first encapsulant 130 is not particularly limited, but may be, for example, an insulating material. For example, the first encapsulant 130 may include ABF including an insulating resin and an inorganic filler. However, the material of the first encapsulant 130 is not limited thereto, but may also be a PIE.

The first connection member 140 may include the first redistribution layer 142 that may redistribute the 1-1-th connection pads 121 of the first semiconductor chip 120. Several tens to several millions of 1-1-th connection pads 121 having various functions may be redistributed by the first connection member 140, and may be physically or electrically externally connected through the electrical connection structures 170 depending on the functions. The first connection member 140 may include a first insulating layer 141, the first redistribution layer 142 disposed on the first insulating layer 141, and first vias 143 electrically connecting the first redistribution layer 142 to the first wiring layer 112a and the 1-1-th connection pads 121. The first connection member 140 may include larger numbers of insulating layers, redistribution layers, and vias, if necessary.

A material of the first insulating layer 141 may be an insulating material. In this case, a photosensitive insulating material such as a PID resin may also be used as the insulating material. This case may be advantageous in forming tiny patterns.

The first redistribution layer 142 may include a conductive material such as copper (Cu), aluminum (Al), silver (Ag), tin (Sn), gold (Au), nickel (Ni), lead (Pb), titanium (Ti), or alloys thereof. The first redistribution layer 142 may perform various functions depending on a design of a corresponding layer. For example, the first redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 142 may include pad patterns for vias, pad patterns for electrical connection structures, and the like.

The first vias 143 may electrically connect the 1-1-th connection pads 121, the first redistribution layer 142, the first wiring layer 112a, and the like, formed on different layers to each other, resulting in an electrical path in the first structure 100A. A material of each of the first vias 143 may be a conductive material such as copper (Cu), aluminum (Al), silver (Ag), tin (Sn), gold (Au), nickel (Ni), lead (Pb), titanium (Ti), or alloys thereof. Each of the first vias 143 may be completely filled with the conductive material, or the conductive material may also be formed along a wall of each of via holes. In addition, each of the vias 143 may have any shape known in the related art including a tapered shape. The first vias 143 may be in physical contact with the 1-1-th connection pads 121 of the first semiconductor chip 120. The first connection member 140 may be a redistribution layer (RLD) directly formed on the 1-1-th active surface.

The backside wiring layer 132 may provide a routing region on the other surface of the first encapsulant 130 opposing one surface of the first encapsulant 130 on which the first connection member 140 is disposed. The backside wiring layer 132 may include a conductive material such as copper (Cu), aluminum (Al), silver (Ag), tin (Sn), gold (Au), nickel (Ni), lead (Pb), titanium (Ti), or alloys thereof. The backside wiring layer 132 may perform various functions depending on a design of a corresponding layer. For example, the backside wiring layer 132 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the backside wiring layer 132 may include pad patterns for vias, pad patterns for electrical connection structures, and the like.

The backside vias 133 may electrically connect the backside wiring layer 132 to the second wiring layer 112b of the first core member 110 and/or the 1-2-th connection pads 122. Therefore, the 1-2-th connection pads 122 may be electrically connected to the mainboard of the electronic device.

A material of each of the backside vias 133 may be a conductive material such as copper (Cu), aluminum (Al), silver (Ag), tin (Sn), gold (Au), nickel (Ni), lead (Pb), titanium (Ti), or alloys thereof. Each of the backside vias 133 may be completely filled with a conductive material, or the conductive material may be formed along a wall of each of via holes. In addition, each of the backside vias 133 may have any shape known in the related art such as a tapered shape.

The passivation layer 150 may protect the backside wiring layer 132. The passivation layer 150 may include an insulating material such as ABF. However, the passivation layer 150 is not limited thereto, but may also include a general solder resist, or the like. The passivation layer 150 may have the openings exposing at least portions of the backside wiring layer 132. The number of openings may be several tens or several millions depending on a design.

The underbump metal layers 160 may be additionally configured to improve connection reliability of the electrical connection structures 170, thereby, improving board level reliability of the fan-out electronic component package. The underbump metal layers 160 may be connected to the backside wiring layer 132 exposed through the openings of the passivation layer 150. In this case, a surface treatment layer (not illustrated) may be formed on the exposed backside wiring layer 132, if necessary. The surface treatment layer may include Ni—Au. The underbump metal layers 160 may be formed by any known metallization method using any known conductive material such as a metal, but are not limited thereto.

The electrical connection structures 170 may be additionally configured to physically or electrically externally connect the fan-out electronic component package. For example, the fan-out electronic component package may be mounted on the mainboard of the electronic device, or the like, through the electrical connection structures 170. Each of the electrical connection structures 170 may be formed of a low melting point metal, for example, a solder such as an alloy including tin (Sn), more specifically, a tin (Sn)-aluminum (Al)-copper (Cu) alloy, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several millions according to the numbers of 1-1-th connection pads 121 and 1-2-th connection pads 122 of the first semiconductor chip 120 and second connection pads of the second semiconductor chip 220, or may be provided in an amount of several tens to several millions or more or several tens to several millions or less.

At least one of the electrical connection structures 170 may be disposed in a fan-out region. The fan-out region refers to a region except for a region in which the first semiconductor chip 120 is disposed in, for example, the first structure 100A. That is, the electronic component package according to the example may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and competitively priced.

The second structure 200A may include the second semiconductor chip 220 having the second active surface having the second connection pads disposed thereon, the second connection member 240 including the second redistribution layer 242 electrically connected to the second connection pads, and the second encapsulant 230 encapsulating at least portions of the second semiconductor chip 220.

The second semiconductor chip 220 may be an integrated circuit (IC) provided in an amount of several hundred to several million or more elements integrated in a single chip. The second semiconductor chip 220 may be formed on the basis of an active wafer. In this case, a base material of a body of the second semiconductor chip 220 may be silicon (Si), germanium (Ge), gallium arsenide (GaAs), or the like. Various circuits may be formed on the body. The second connection pads may electrically connect the second semiconductor chip 220 to other components, and a conductive material such as aluminum (Al), or the like, may be used as a material of each of the second connection pads. An active surface of the second semiconductor chip 220 refers to a surface of the second semiconductor chip 220 on which the second connection pads are disposed, and an inactive surface of the second semiconductor chip 220 refers to a surface of the second semiconductor chip 220 opposing the active surface. A passivation layer (not illustrated) covering at least portions of the second connection pads may be formed on the body, if necessary. The passivation layer (not illustrated) may be an oxide layer, a nitride layer, or the like, or be a double layer of an oxide layer and a nitride layer. An insulating layer (not illustrated), and the like, may also be further disposed in other required positions. The second semiconductor chip 220 may be a memory chip such as a volatile memory (such as a DRAM), a non-volatile memory (such as a ROM), a flash memory, or the like. However, the second semiconductor chip 220 is not limited thereto, but may also be another kind of chip.

The second encapsulant 230 may protect the second semiconductor chip 220. An encapsulation form of the second encapsulant 230 is not particularly limited, but may be a form in which the second encapsulant 230 surrounds at least portions of the second semiconductor chip 220. For example, the second encapsulant 230 may cover the inactive surface of the second semiconductor chip 220. A certain material of the second encapsulant 230 is not particularly limited, but may be, for example, an insulating material. For example, the second encapsulant 230 may include ABF including an insulating resin and an inorganic filler. However, the material of the second encapsulant 230 is not limited thereto, but may also be a PIE.

The second connection member 240 may include the second redistribution layer 242 that may redistribute the second connection pads of the second semiconductor chip 220. Several tens to several millions of second connection pads having various functions may be redistributed by the second connection member 240, and may be physically or electrically externally connected through the electrical connection structures 170 depending on the functions. The second connection member 240 may include a second insulating layer 241, the second redistribution layer 242 disposed on the second insulating layer 241, and second vias 243 electrically connecting the second redistribution layer 242 to the second connection pads. The second connection member 240 may include larger numbers of insulating layers, redistribution layers, and vias, if necessary.

A material of the second insulating layer 241 may be an insulating material. In this case, a photosensitive insulating material such as a PID resin may also be used as the insulating material. This case may be advantageous in forming fine patterns.

The second redistribution layer 242 may include a conductive material such as copper (Cu), aluminum (Al), silver (Ag), tin (Sn), gold (Au), nickel (Ni), lead (Pb), titanium (Ti), or alloys thereof. The second redistribution layer 242 may perform various functions depending on a design of a corresponding layer. For example, the second redistribution layer 242 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layer 242 may include pad patterns for vias, pad patterns for electrical connection structures, and the like.

The second vias 243 may electrically connect the second connection pads, the second redistribution layer 242, and the like, formed on different layers to each other, resulting in an electrical path in the second structure 200A. A material of each of the second vias 243 may be a conductive material such as copper (Cu), aluminum (Al), silver (Ag), tin (Sn), gold (Au), nickel (Ni), lead (Pb), titanium (Ti), or alloys thereof. Each of the second vias 243 may be completely filled with the conductive material, or the conductive material may also be formed along a wall of each of via holes. In addition, each of the second vias 243 may have any shape known in the related art such as a tapered shape. The second vias 243 may be in physical contact with the second connection pads of the second semiconductor chip 220. The second connection member 240 may be a redistribution layer (RLD) directly formed on the second active surface.

The first redistribution layer 142 and the second redistribution layer 242 may be connected to each other through the low melting point metal. That is, the first redistribution layer 142 and the second redistribution layer 242 may be in physical contact with the low melting point metal. The low melting point metal refers to a metal of which a base material is not melted and only a filler metal is melted and which is used for bonding, such as a solder, and may be, for example, tin (Sn) or an alloy including tin (Sn) such as a tin (Sn)-aluminum (Al) alloy or a tin (Sn)-aluminum (Al)-copper (Cu) alloy, but is not limited thereto. Meanwhile, a melting point of the low melting point metal may be higher than that of the electronic connection structure 170. A surface treatment layer (not illustrated) may be formed on a surface of the first redistribution layer 142 in contact with the low melting point metal. In this case, the surface treatment layer (not illustrated) may include one or more of palladium (Pd), nickel (Ni), and gold (Au).

The underfill resin may be disposed between the first connection member 140 and the second connection member 240, and may cover the first redistribution layer 142, the second redistribution layer 242, and the low melting point metal. The underfill resin may include an epoxy resin, or the like.

Figure 10:
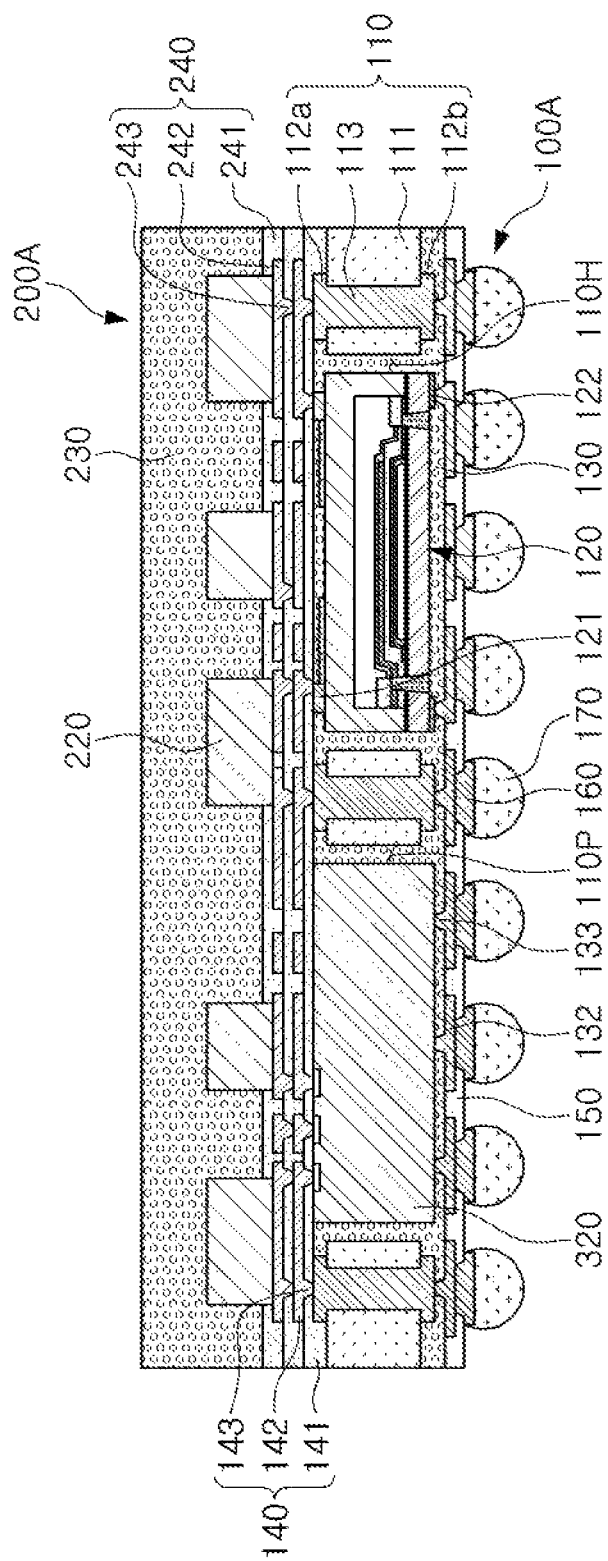
FIG. 10 is a schematic cross-sectional view illustrating another example of a fan-out electronic component package.

FIG. 10 is a schematic cross-sectional view illustrating another example of a fan-out electronic component package.

Referring to FIG. 10, a first through-hole 110H and a second through-hole 110P may be formed in a first core member 110 of a first structure 100A. The first through-hole 110H and the second through-hole 110P may be disposed to be spaced apart from each other.

A first semiconductor chip 120 having a 1-1-th active surface having 1-1-th connection pads 121 disposed thereon and a 1-2-th active surface having 1-2-th connection pads 122 disposed thereon and opposing the 1-1-th active surface may be disposed in the first through-hole 110H.

A third semiconductor chip 320 having a 1-3-th active surface having 1-3-th connection pads disposed thereon may be disposed in the second through-hole 110P.

A first encapsulant 130 may encapsulate at least portions of the first semiconductor chip 120 and the third semiconductor chip 320, and fill at least portions of the first through-hole 110H and the second through-hole 110P.

The first connection member 140 may include a first redistribution layer 142 disposed on the first core member 110, the 1-1-th active surface, and the 1-3-th active surface and electrically connected to the 1-1-th connection pads 121 and the 1-3-th connection pads.

A description of other configurations may overlap that described above, and is thus omitted.

Figure 11:
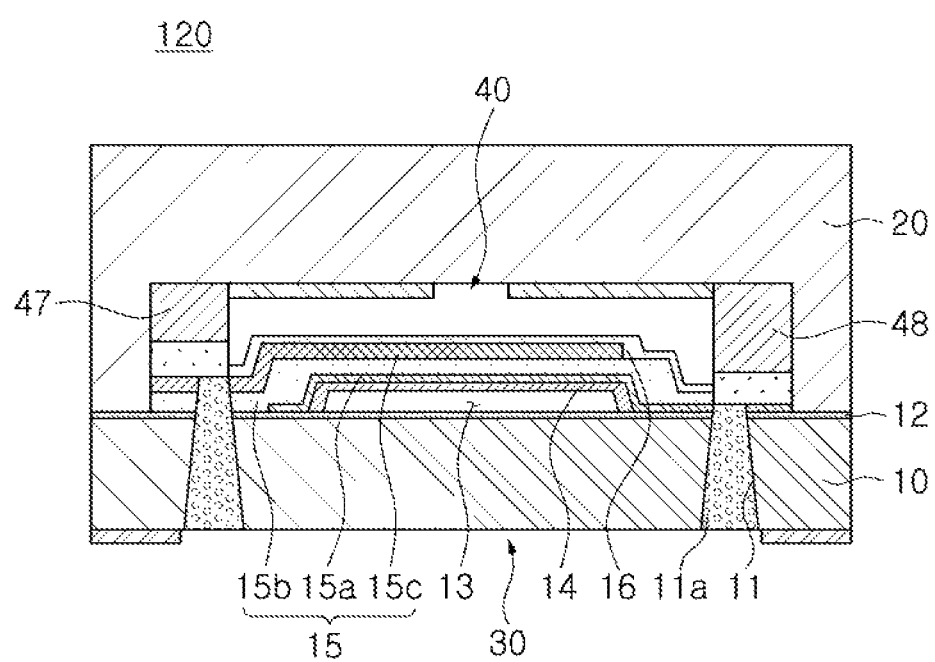
FIG. 11 is a schematic cross-sectional view illustrating an example of a first electronic component.
Figure 12:
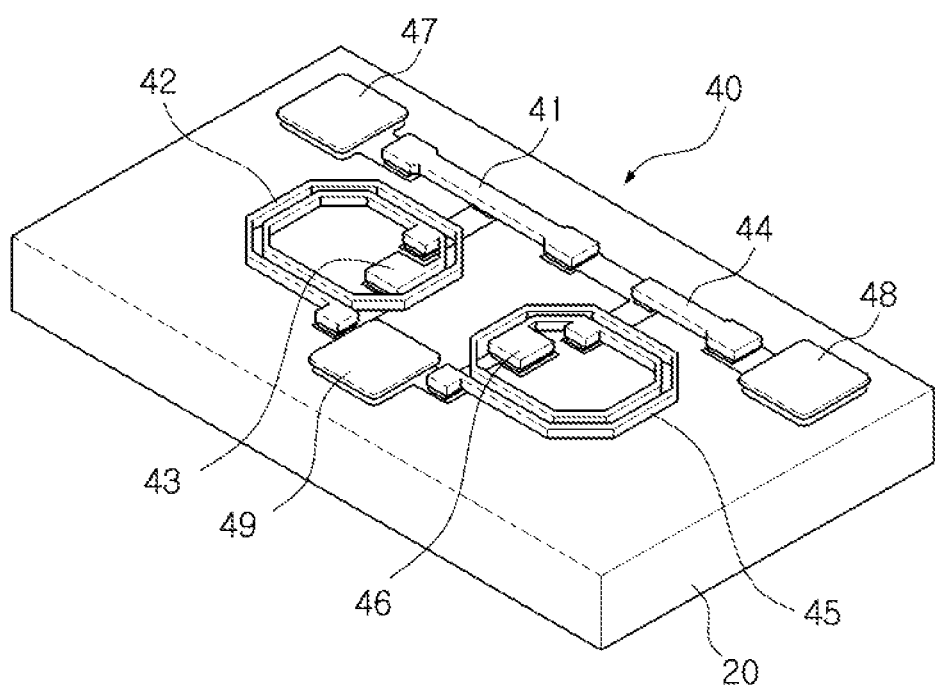
FIG. 12 is a schematic perspective view illustrating a second filter of the first electronic component.

FIG. 11 is a schematic cross-sectional view illustrating an example of a first electronic component, and FIG. 12 is a schematic perspective view illustrating a second filter of the first electronic component.

In the present example, the first electronic component may be a filter structure including a bulk acoustic resonator.

Referring to FIG. 11, the first electronic component 120 may include a plurality of filters configured to filter different frequency bands.

As an example, the first electronic component 120 may include a first substrate 10, a second substrate 20, a first filter 30 formed on the first substrate 10, and a second filter 40 formed on the second substrate 20.

The first substrate 10 and the second substrate 20 may be coupled to each other to form an internal space. Here, the first substrate 10 and the second substrate 20 may be high resistivity silicon (HRS) substrates.

Therefore, the first substrate 10 and the second substrate 20 may have excellent signal isolation characteristics to implement a high quality (Q) factor value and a low loss signal line.

The first filter 30 may be formed on the first substrate 10 to be disposed in the internal space formed by the first substrate 10 and the second substrate 20.

The first filter 30 may include a bulk acoustic resonator. The bulk acoustic resonator may be a film bulk acoustic resonator (FBAR).

The bulk acoustic resonator may be implemented by a multilayer structure including a plurality of films. The bulk acoustic resonator may include an insulating layer 12, an air cavity 13, and a resonant portion 15.

The insulating layer 12 electrically isolating the resonant portion 15 from the first substrate 10 may be provided on an upper surface of the first substrate 10. The insulating layer 12 may be formed on the first substrate 10 by performing chemical vapor deposition, radio frequency (RF) magnetron sputtering, or evaporation using one of a silicon dioxide ($SiO_2$) or an aluminum oxide ($Al_2O_3$).

The air cavity 13 may be disposed on the insulating layer 12. The air cavity 13 may be positioned below the resonant portion 15 so that the resonant portion 15 may vibrate in a predetermined direction. The air cavity 13 may be formed by forming an air cavity sacrificial layer pattern on the insulating layer 12, forming a membrane 14 on the air cavity sacrificial layer pattern, and then etching and removing the air cavity sacrificial layer pattern. The membrane 14 may serve as an oxidation protecting layer or a protecting layer protecting the first substrate 10.

An etch stop layer may be additionally formed between the insulating layer 12 and the air cavity 13. The etch stop layer may serve to protect the first substrate 10 and the insulating layer 12 from an etching process, and may serve as a base required for depositing several other layers on the etch stop layer.

The resonant portion 15 may include a first electrode 15a, a piezoelectric layer 15b, and a second electrode 15c sequentially stacked on the membrane 14. A common region in which the first electrode 15a, the piezoelectric layer 15b, and the second electrode 15c overlap one another in a vertical direction may be positioned above the air cavity 13.

The first electrode 15a and the second electrode 15c may be formed of one of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof.

The piezoelectric layer 15b, which generates a piezoelectric effect that electric energy is converted into mechanical energy having an elastic wave form, may be formed of one of aluminum nitride (AlN), zinc oxide (ZnO), and lead zirconate titanate oxide (PZT; PbZrTiO). In addition, the piezoelectric layer 15b may further include a rare earth metal. As an example, the rare earth metal may include any one or any combination of any two or more of scandium (Sc), erbium (Er), yttrium (Y), and lanthanum (La). The piezoelectric layer 15b may include 1 to 20 at % of rare earth metal.

A seed layer for improving crystal alignment of the piezoelectric layer 15 may be additionally disposed below the first electrode 15a. The seed layer may be formed of one of aluminum nitride (AlN), zinc oxide (ZnO), and lead zirconate titanate oxide (PZT; PbZrTiO) having the same crystallinity as that of the piezoelectric layer 15b.

The resonant portion 15 may be divided into an active region and an inactive region. The active region of the resonant portion 15, which is a region vibrating and resonating in a predetermined direction by a piezoelectric phenomenon occurring in the piezoelectric layer 15b when electric energy such as a radio frequency signal is applied to the first electrode 15a and the second electrode 15c, may correspond to a region in which the first electrode 15a, the piezoelectric layer 15b, and the second electrode 15c overlap one another in the vertical direction above the air cavity 13. The inactive region of the resonant portion 15, which is a region that does not resonate by the piezoelectric phenomenon even through the electric energy is applied to the first electrode 15a and the second electrode 15c, may correspond to a region outside the active region.

The resonant portion 15 may output a radio frequency signal having a specific frequency using the piezoelectric phenomenon. In detail, the resonant portion 15 may output a radio frequency signal having a resonant frequency corresponding to vibrations depending on the piezoelectric phenomenon of the piezoelectric layer 15b.

A protecting layer 16 may be disposed on the second electrode 15c of the resonant portion 15 to prevent the second electrode 15c from being externally exposed. The protecting layer 16 may be formed of one of a silicon oxide based insulating material, a silicon nitride based insulating material, and an aluminum nitride based insulating material.

At least one via hole 11 penetrating through the first substrate 10 in a thickness direction may be formed in the first substrate 10. The via hole 11 may penetrate through portions of the insulating layer 12, the first electrode 15a, the piezoelectric layer 15b, and the second electrode 15c in the thickness direction, in addition to the first substrate 10. A connection pattern 11a may be formed in the via hole 11, and may be formed over the entirety of an inner surface, that is, an inner wall, of the via hole 11.

The connection pattern 11a may be manufactured by forming a conductive layer on the inner surface of the via hole 113. For example, the connection pattern 11a may be formed by depositing, applying, or filling any one or any combination of any two or more of conductive metals such as gold (Au), copper (Cu), and a titanium (Ti)-copper (Cu) alloy along the inner wall of the via hole 11.

The connection pattern 11a may be connected to at least one of the first electrode 15a and the second electrode 15c. As an example, the connection pattern 11a may penetrate through at least portions of the first substrate 10, the insulating layer 12, the first electrode 15a, the piezoelectric layer 15b, and the second electrode 15c, and be then electrically connected to at least one of the first electrode 15a and the second electrode 15c. The connection pattern 11a formed on the inner surface of the via hole 11 may extend to a lower surface of the first substrate 10 to be thus connected to 1-2-th connection pads 122 provided on the lower surface of the first substrate 10. Therefore, the connection pattern 11a may electrically connect the first electrode 15a and the second electrode 15c to the 1-2-th connection pads 122.

The 1-2-th connection pads 122 may be electrically connected to an external substrate that may be disposed below the first filter 30. As an example, the 1-2-th connection pads 122 may be connected to a backside wiring layer 132 by backside vias 133 penetrating through at least portions of a first encapsulant 130, and may thus be electrically connected to a mainboard of an electronic device.

The first filter 30 may perform a filtering operation of a radio frequency signal by a signal applied to the first electrode 15a and the second electrode 15b through the 1-2-th connection pads 122.

Meanwhile, the second substrate 20 may be bonded to the multilayer structure forming the first filter 30 to protect the first filter 30 from an external environment. The second substrate 20 may have a cover form with the internal space in which the first filter 30 is disposed. The second substrate 20 may have a hexahedral shape in which a lower surface thereof is opened, and thus have an upper surface and a plurality of side surfaces.

In detail, the second substrate 20 may have an accommodating portion formed at the center thereof to accommodate the resonant portion 15 of the first filter 30 therein, and an outer region of the accommodating portion may be bonded to a bonded region of the multilayer structure. The bonded region of the multilayer structure may correspond to an edge of the multilayer structure.

Referring to FIG. 11, a case in which the second substrate 20 is bonded to the insulating layer 12 stacked on the first substrate 10 is illustrated, but the second substrate 20 may also be bonded to at least one of the membrane 14, the etch stop layer, and the first substrate 10, in addition to the insulating layer 12.

The first electronic component 120 may include the plurality of filters configured to filter the different frequency bands. As an example, the filter structure 120 may further include the second filter 40 formed on the second substrate 20, in addition to the first filter 30 formed on the first substrate 10.

As illustrated in FIG. 12, the second filter 40 may be a band pass filter (BPF). However, the second filter 40 is not limited to the band pass filter (BPF) and may be an active filter (such as a diplexer (DPX), a low pass filter (LPF), a high pass filter (HPF), a coupler, and the like), or be a passive filter.

Referring to FIG. 12, the second filter 40 may include spiral inductors 42 and 45, capacitors 43 and 46, input and output ports 47 and 48, a ground 49, and circuit lines 41 and 44 formed on the second substrate 20. The circuit lines 41 and 44 may connect the input and output ports 47 and 48 to the spiral inductors 42 and 45 and the capacitors 43 and 46, respectively.

The second filter 40 may be formed on the substrate 20 to be disposed in the internal space formed by the first substrate 10 and the second substrate 20. In addition, the first filter 30 and the second filter 40 may be disposed to face each other in the internal space.

Therefore, the first filter 30 and the second filter 40 may be disposed in the internal space formed by the first substrate 10 and the second substrate 20. That is, since the plurality of filters may be formed in one electronic component, the electronic component may be miniaturized. Therefore, the size of the electronic device in which the electronic component is mounted may be reduced when compared to structures disclosed in related arts.

The second filter 40 may be electrically connected to the connection pattern 11*a* formed in the via hole 11 of the first substrate 10 to be thus electrically connected to the external substrate. Therefore, the second filter 40 may perform a filtering operation of a radio frequency signal.

In the present example, the first filter 30 and the second filter 40 may be configured to filter frequencies in different bands.

As an example, the first filter 30 may filter a frequency in a 2 GHz band, and the second filter 40 may filter a frequency in a 5 GHz band.

That is, the plurality of filters configured to filter the frequencies in the different bands may be implemented in one electronic component, resulting in the miniaturization of the electronic device.

Figure 13:
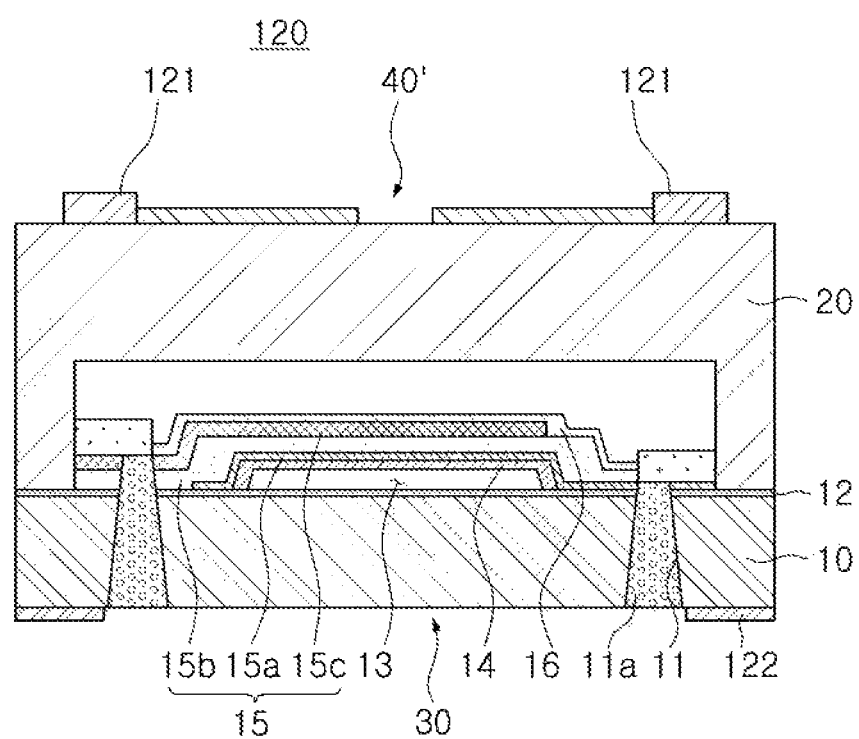
FIG. 13 is a schematic cross-sectional view illustrating another example of a first electronic component.
Figure 14:
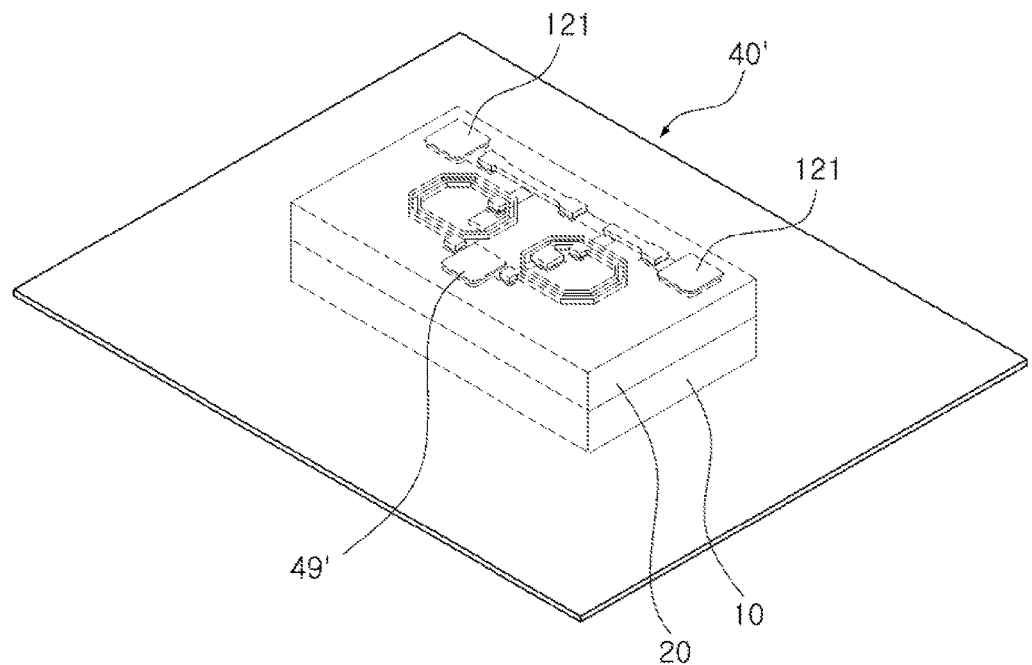
FIG. 14 is a schematic perspective view illustrating another example of the first electronic component.

FIG. 13 is a schematic cross-sectional view illustrating another example of a first electronic component, and FIG. 14 is a schematic perspective view illustrating another example of the first electronic component.

Referring to FIGS. 13 and 14, a first electronic component 120 is the same as the first electronic component 120 described with reference to FIGS. 11 and 12 except for a disposition form of a second filter 40', and a description except for the disposition form of the second filter 40' is thus omitted.

In the first electronic component 120 described with reference to FIGS. 11 and 12, the second filter 40 may be disposed in the internal space formed by the first substrate 10 and the second substrate 20, but in the first electronic component 120 according to an example of FIGS. 13 and 14, the second filter 40' may be formed on an outer surface of the second substrate 20.

As an example, the second filter 40' may be formed on the other surface of the second substrate 20 opposing one surface of the second substrate 20 forming the internal space together with the first substrate 10.

1-1-th connection pads 121 may be disposed on the outer surface of the second substrate 20, and may be electrically connected to a first redistribution layer 142 and the second filter 40'.

Therefore, the second filter 40' may perform a filtering operation of a radio frequency signal.

Figure 15:
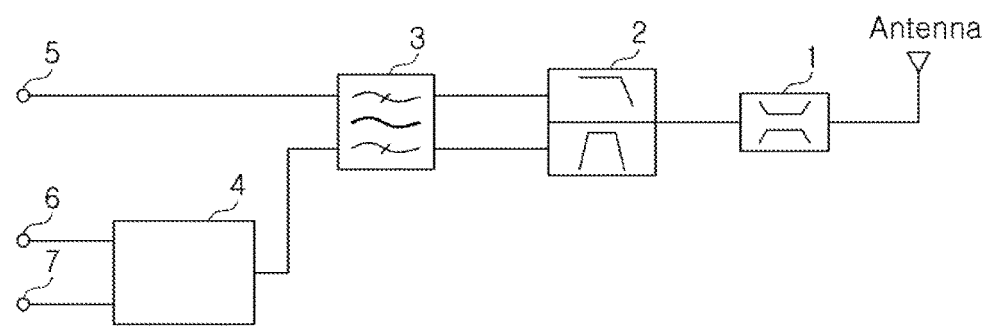
FIG. 15 is a block diagram illustrating an example of a front end module including a filter structure.

FIG. 15 is a block diagram illustrating an example of a front-end module including a filter structure.

The front end module illustrated in FIG. 15 may be used in an electronic device performing wireless communications using various communications networks such as global system for mobile communications (GSM), general packet radio service (GPRS), enhanced data GSM environment (EDGE), universal mobile telecommunications system (UMTS), code division multiple access (CDMA), wideband code division multiple access (WCDMA), long term evolution (LTE), wireless broadband Internet (Wibro), and the like, and networks extended and deformed from the networks described above. The wireless communications networks described above may perform wireless communications in a multi-band manner using various frequency bands.

Referring to FIG. 15, the front-end module may include an antenna, a coupler 1, a diplexer 2, and a filter structure 3.

The antenna may transmit and receive radio frequency signals having a plurality of frequency bands, and the coupler 1 may serve to detect strength of the radio frequency signals.

In addition, the diplexer 2 may isolate the radio frequency signals having the plurality of frequency bands for each of the frequency bands. The radio frequency signals isolated by the diplexer 2 may be transferred to the filter structure 3.

The filter structure 3 may be the first electronic component 120 described above.

The filter structure 3 may be configured to independently receive the isolated radio frequency signals from the diplexer 2 and filter the isolated radio frequency signals.

As an example, the filter structure 3 may filter a frequency in a 2 GHz band and a frequency in a 5 GHz band.

The frequency in the 2 GHz band filtered by the filter structure 3 may be provided to a first transmit/receive end 5, and the frequency in the 5 GHz band filtered by the filter structure 3 may be provided to a second transmit end 6 and a second receive end 7 through an amplifier 4.

That is, the front-end module may be configured so that the frequencies in the different bands may be filtered by one filter structure, resulting in the miniaturization of the electronic device.

As set forth above, the fan-out electronic component package according to the examples in the present disclosure may be configured to have a thinner profile and miniaturized, which may reduce signal loss by shortening the connection distance between chips while reliably securing the chips to have sufficient rigidity.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A fan-out electronic component package, comprising:
   a core member comprising a through-hole, wiring layers and vias configured to electrically connect the wiring layers to each other;
   a first electronic component disposed in the through-hole, and comprising filters configured to filter different frequency bands;

a first encapsulant disposed to cover portions of the core member and the first electronic component, and fill portions of the through-hole;
a connection member disposed on the core member and the first electronic component, and comprising a redistribution layer electrically connected to the wiring layers and the first electronic component;
a second electronic component disposed on the connection member and electrically connected to the redistribution layer; and
a second encapsulant disposed to cover the second electronic component,
wherein the first electronic component comprises a first active surface comprising a first connection pad disposed thereon and a second active surface opposite the first active surface and comprising a second connection pad disposed thereon.

2. The fan-out electronic component package of claim 1, wherein the connection member comprises an insulating layer, the redistribution layer disposed on the insulating layer, and vias configured to electrically connect the redistribution layer and the first electronic component to each other.

3. The fan-out electronic component package of claim 1, wherein the first connection pad is electrically connected to the connection member and the second connection pad is electrically connected to a mainboard of an electronic device.

4. The fan-out electronic component package of claim 1, wherein the first electronic component comprises:
a first substrate and a second substrate coupled to each other to form an internal space;
a first filter formed on the first substrate to be disposed in the internal space, and comprising a bulk acoustic resonator; and
a second filter formed on the second substrate.

5. The fan-out electronic component package of claim 4, wherein the first connection pad electrically connected to the redistribution layer is formed on the second substrate, and the second connection pad electrically connected to a mainboard of an electronic device is formed on the first substrate.

6. The fan-out electronic component package of claim 5, further comprising:
a backside wiring layer disposed on a surface of the first encapsulant opposing another surface of the first encapsulant on which the connection member is disposed;
backside vias configured to penetrate through the first encapsulant and connect the backside wiring layer to the second connection pad; and
underbump metal layers connected to the backside wiring layer.

7. The fan-out electronic component package of claim 4, wherein the second filter is formed on an outer surface of the second substrate.

8. The fan-out electronic component package of claim 4, wherein the first substrate and the second substrate are high resistivity silicon (HRS) substrates.

9. A fan-out electronic component package, comprising:
a first structure comprising:
a first electronic component having a first active surface and a second active surface, wherein a first connection pad is disposed on the first active surface, a second connection pad is disposed on the second active surface, and the second active surface opposes the first active surface;
a first encapsulant encapsulating portions of the first electronic component; and
a first connection member disposed on the first active surface and comprising a first redistribution layer electrically connected to the first connection pad; and
a second structure comprising:
a second electronic component having a third active surface, wherein a third connection pad is disposed on the third active surface;
a second encapsulant encapsulating portions of the second electronic component; and
a second connection member disposed on the third active surface and comprising a second redistribution layer electrically connected to the third connection pad,
wherein the first electronic component comprises filters configured to filter different frequency bands.

10. The fan-out electronic component package of claim 9, further comprising:
a backside wiring layer disposed on a surface of the first encapsulant opposing another surface of the first encapsulant on which the first connection member is disposed;
backside vias configured to penetrate through the first encapsulant and connect the backside wiring layer to the second connection pad; and
underbump metal layers connected to the backside wiring layer.

11. The fan-out electronic component package of claim 9, wherein the first electronic component comprises:
first and second substrates coupled to each other to form an internal space;
a first filter formed on the first substrate to be disposed in the internal space, connected to the second connection pad, and comprising a bulk acoustic resonator; and
a second filter formed on the second substrate to be disposed outside the internal space and connected to the first connection pad.

12. The fan-out electronic component package of claim 9, wherein the first structure further comprises a first core member having a first through-hole, and
the first electronic component is disposed in the first through-hole.

13. The fan-out electronic component package of claim 9, wherein the first structure further comprises a first core member having a first through-hole and a second through-hole spaced apart from the first through-hole, and
the first electronic component is disposed in the first through-hole, and a semiconductor chip is disposed in the second through-hole.

14. A fan-out electronic component package, comprising:
a core member comprising a through-hole, wiring layers and vias configured to electrically connect the wiring layers to each other;
a first electronic component disposed in the through-hole, and comprising filters configured to filter different frequency bands;
a first encapsulant disposed to cover portions of the core member and the first electronic component, and fill portions of the through-hole;
a connection member disposed on the core member and the first electronic component, and comprising a redistribution layer electrically connected to the wiring layers and the first electronic component;
a second electronic component disposed on the connection member and electrically connected to the redistribution layer; and a second encapsulant disposed to cover the second electronic component,
wherein the first electronic component comprises:
a first substrate and a second substrate coupled to each other to form an internal space;
a first filter formed on the first substrate to be disposed in the internal space, and comprising a bulk acoustic resonator; and
a second filter formed on the second substrate.

15. The fan-out electronic component package of claim 14, wherein the connection member comprises an insulating layer, the redistribution layer disposed on the insulating layer, and vias configured to electrically connect the redistribution layer and the first electronic component to each other.

16. The fan-out electronic component package of claim 14, wherein a first connection pad electrically connected to the connection member and a second connection pad electrically connected to a mainboard of an electronic device are formed on the first electronic component.

17. The fan-out electronic component package of claim 14, wherein the first connection pad electrically connected to the redistribution layer is formed on the second substrate, and the second connection pad electrically connected to the mainboard of an electronic device is formed on the first substrate.

18. The fan-out electronic component package of claim 14, further comprising:
a backside wiring layer disposed on a surface of the first encapsulant opposing another surface of the first encapsulant on which the connection member is disposed;
backside vias configured to penetrate through the first encapsulant and connect the backside wiring layer to the second connection pad; and
underbump metal layers connected to the backside wiring layer.

19. The fan-out electronic component package of claim 14, wherein the second filter is formed on an outer surface of the second substrate.

20. The fan-out electronic component package of claim 14, wherein the first substrate and the second substrate are high resistivity silicon (HRS) substrates.

* * * * *